(12) United States Patent
Edwards et al.

(10) Patent No.: US 11,444,075 B2
(45) Date of Patent: *Sep. 13, 2022

(54) ISOLATION STRUCTURE FOR IC WITH EPI REGIONS SHARING THE SAME TANK

(71) Applicant: TEXAS INSTRUMENTS INCORPORATED, Dallas, TX (US)

(72) Inventors: Henry Litzmann Edwards, Garland, TX (US); Akram A. Salman, Plano, TX (US); Binghua Hu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 237 days.

This patent is subject to a terminal disclaimer.

(21) Appl. No.: 16/666,563

(22) Filed: Oct. 29, 2019

(65) Prior Publication Data

US 2020/0066710 A1  Feb. 27, 2020

Related U.S. Application Data

(60) Continuation of application No. 15/895,694, filed on Feb. 13, 2018, now Pat. No. 10,461,072, which is a
(Continued)

(51) Int. Cl.
| | |
|---|---|
| *H01L 27/02* | (2006.01) |
| *H01L 29/10* | (2006.01) |
| *H01L 29/06* | (2006.01) |
| *H01L 21/265* | (2006.01) |
| *H01L 21/763* | (2006.01) |
| *H01L 21/762* | (2006.01) |
| *H01L 21/8222* | (2006.01) |
| *H01L 27/06* | (2006.01) |

(52) U.S. Cl.
CPC ........ *H01L 27/0259* (2013.01); *H01L 21/265* (2013.01); *H01L 21/26513* (2013.01); *H01L 21/762* (2013.01); *H01L 21/763* (2013.01); *H01L 21/76237* (2013.01); *H01L 21/8222* (2013.01); *H01L 29/06* (2013.01); *H01L 29/0692* (2013.01); *H01L 29/10* (2013.01); *H01L 29/1095* (2013.01); *H01L 27/0623* (2013.01)

(58) Field of Classification Search
None
See application file for complete search history.

(56) References Cited

U.S. PATENT DOCUMENTS

| | | |
|---|---|---|
| 5,134,537 A | 7/1992 | Buss et al. |
| 5,485,027 A | 1/1996 | Williams et al. |
| (Continued) | | |

*Primary Examiner* — Alexander G Ghyka
(74) *Attorney, Agent, or Firm* — Andrew R. Ralston; Charles A. Brill; Frank D. Cimino

(57) ABSTRACT

An integrated circuit (IC) includes a semiconductor substrate in which a plurality of spaced-apart deep trench (DT) structures are formed. The IC further includes a plurality of DEEPN diffusion regions, each DEEPN diffusion region surrounding a corresponding one of the DT structures. Each of the DEEPN diffusion regions merges with at least one neighboring DEEPN diffusion region that surrounds at least one neighboring DT structure. The merged DEEPN diffusion regions may partially isolate two electronic devices, e.g. ESD devices.

19 Claims, 3 Drawing Sheets

Related U.S. Application Data division of application No. 14/713,785, filed on May 15, 2015, now Pat. No. 9,929,140.

(60) Provisional application No. 62/001,780, filed on May 22, 2014.

(56) References Cited

U.S. PATENT DOCUMENTS

| | | |
|---|---|---|
| 10,461,072 B2 * | 10/2019 | Edwards ............... H01L 21/762 |
| 10,790,275 B2 * | 9/2020 | Chen .................... H01L 29/0821 |
| 2001/0025968 A1 | 10/2001 | Osanai |
| 2002/0145164 A1 | 10/2002 | Kunz et al. |
| 2007/0262296 A1 | 11/2007 | Bauer |
| 2008/0087978 A1 | 4/2008 | Coolbaugh et al. |
| 2008/0173949 A1 | 7/2008 | Ma et al. |
| 2010/0171149 A1 | 7/2010 | Denison et al. |
| 2015/0021687 A1 | 1/2015 | Tamura et al. |

\* cited by examiner

ISOLATION STRUCTURE FOR IC WITH EPI REGIONS SHARING THE SAME TANK

CROSS REFERENCE TO RELATED APPLICATIONS

This continuation application is related to U.S. patent application Ser. No. 15/895,694, and claims priority to U.S. patent application Ser. No. 14/713,785, filed on May 15, 2015, which claims the benefit of U.S. Provisional Application Ser. No. 62/001,780 entitled "Method to Isolate PEPI Regions Sharing the Same Tank," filed May 22, 2014, all of which are incorporated by reference in their entirety.

FIELD

Disclosed embodiments relate to isolation structures for integrated circuits having epitaxial regions sharing the same tank.

BACKGROUND

In integrated circuits (ICs) some form of electrical isolation is used to electrically isolate adjacent devices from one another. The isolation can be junction isolation, dielectric isolation, or a combination of junction isolation and dielectric isolation.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize for certain devices, such as for certain electrostatic discharge (ESD) protection devices for BiCMOS-based integrated circuits (ICs), it can be desirable to isolate devices in first and second lightly p-type doped epitaxial body regions (hereafter p-epi) that share an isolation tank while still preserving a strong ohmic n+ buried layer (NBL) and deep n+(DEEPN) connection between the first and second p-epi regions. Disclosed embodiments include ICs that have an n+ buried layer (NBL) within a p-epi layer on a substrate. An outer deep trench isolation ring (outer DT ring) includes dielectric sidewalls having a deep n-type diffusion (DEEPN diffusion) configured as a ring (DEEPN ring) contacting the dielectric sidewalls extending downward to the NBL. The DEEPN ring defines an enclosed p-epi region.

A plurality of inner DT structures are within the enclosed p-epi region having dielectric sidewalls and DEEPN diffusions contacting the dielectric sidewalls extending downward from a surface nwell at the topside surface of the p-epi layer to the NBL. The inner DT structures have a sufficiently small spacing with one another so that adjacent DEEPN diffusion regions overlap to form continuous wall of n-type material extending from a first side to a second side of the outer DT ring for dividing the enclosed p-epi region into a first and a second p-epi region. The first and second p-epi region are connected to one another by the NBL.

BRIEF DESCRIPTION OF THE DRAWINGS

Reference will now be made to the accompanying drawings, which are not necessarily drawn to scale, wherein.

DETAILED DESCRIPTION

Figure 1A:
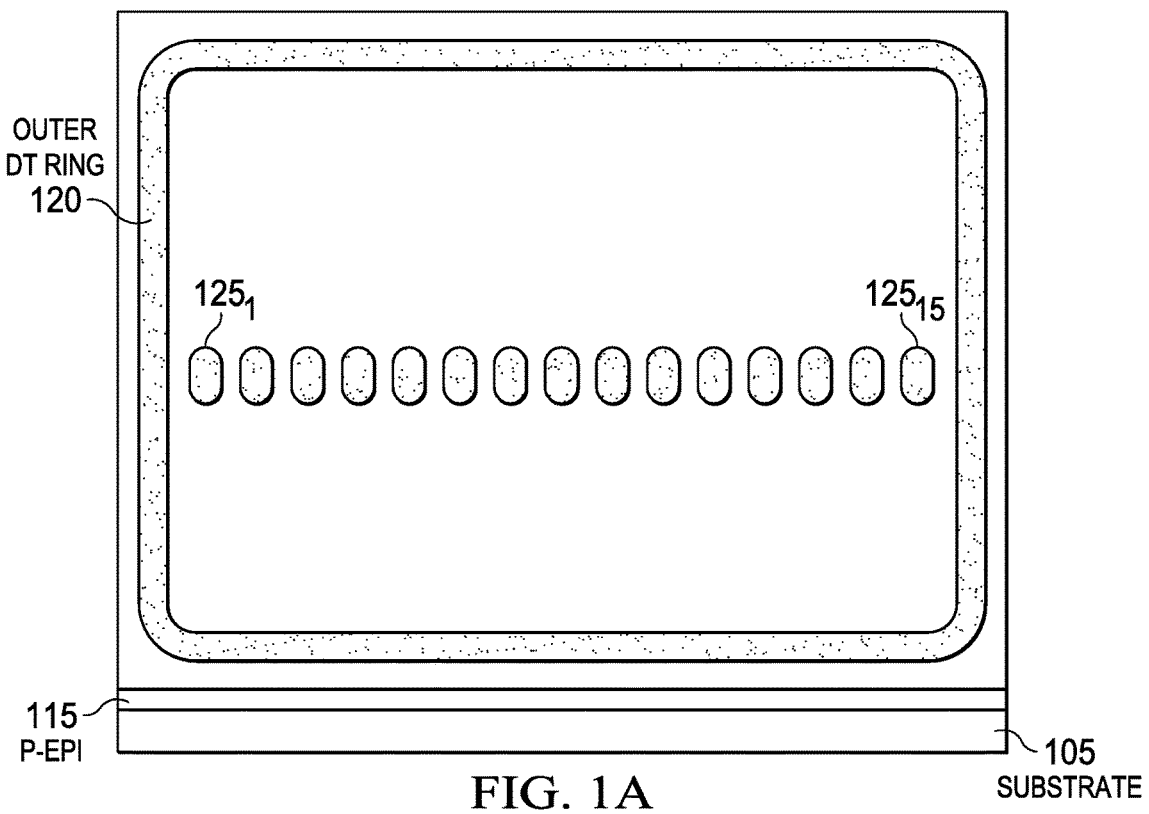
FIG. 1A shows an outer DT ring with a line of fifteen (15) inner DT structures extending from one side to another of the of the outer DT ring before a DEEPN diffusion process, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

As noted above, disclosed embodiments recognize for processes such as BiCMOS having drain extended MOS (DEMOS) transistors, low voltage complementary metal oxide semiconductor (CMOS) and bipolar transistors when the p-epi layer is relatively thick (e.g., about 9 µm) the n-type drift region diffusions provided in the process may not be deep enough to reach the NBL. As a result, it is not possible to junction isolate two neighboring p-epi regions in a common tank using these diffusions. In some previous process nodes, the p-epi layer is thinner so that it is possible to reach from the top of the p-epi layer surface down to NBL using diffusions provided in the process.

Disclosed embodiments provide methods to form a "wall" of n-type doping connecting respective sides of an outer DT ring providing junction isolation for neighboring p-epi regions in a common DEEPN+ NBL tank despite a thick p-epi layer to provide isolation of neighboring p-epi regions in the same DEEPN+ NBL tank. In disclosed embodiments, a plurality of inner DT structures are placed in a row (or otherwise positioned, see FIGS. 2A-2C described below) spanning one side to another side of a conventional outer DT ring that surrounds the DEEPN/NBL n-tank. The inner DTs structures are placed sufficiently close to one another so that the neighboring DEEPN diffusions emanating from these inner DTs after high temperature annealing provided in the process will merge into a continuous wall of n-type material that prevents direct connection between the neighboring p-epi regions on respective sides of the wall. The NBL of the respective p-EPI regions remains connected, however, so that current may pass between the two neighboring n-tank regions through the NBL without having to reach the surface through the relatively resistive DEEPN diffusions. No additional masks or processing is needed to implement disclosed isolation structures for ICs with epi regions sharing the same tank.

FIG. 1A shows an outer DT ring 120 with a line of fifteen (15) inner DT structures $125_1$ to $125_{15}$ extending from the left side to the right side of the outer DT ring 120 before a DEEPN diffusion process, on an p-epi layer 115 on a substrate 105, according to an example embodiment. The outer DT ring 120 and inner DT structures $125_1$ to $125_{15}$ comprise at least a dielectric sidewall that can be entirely dielectric filled, or dielectric lined and filled with another material, such as polysilicon which can be doped to provide electrical contact to the p-epi layer 115 below the NBL (see NBL 110 within p-epi layer 115 in FIGS. 1C and 1D described below).

Figure 1B:
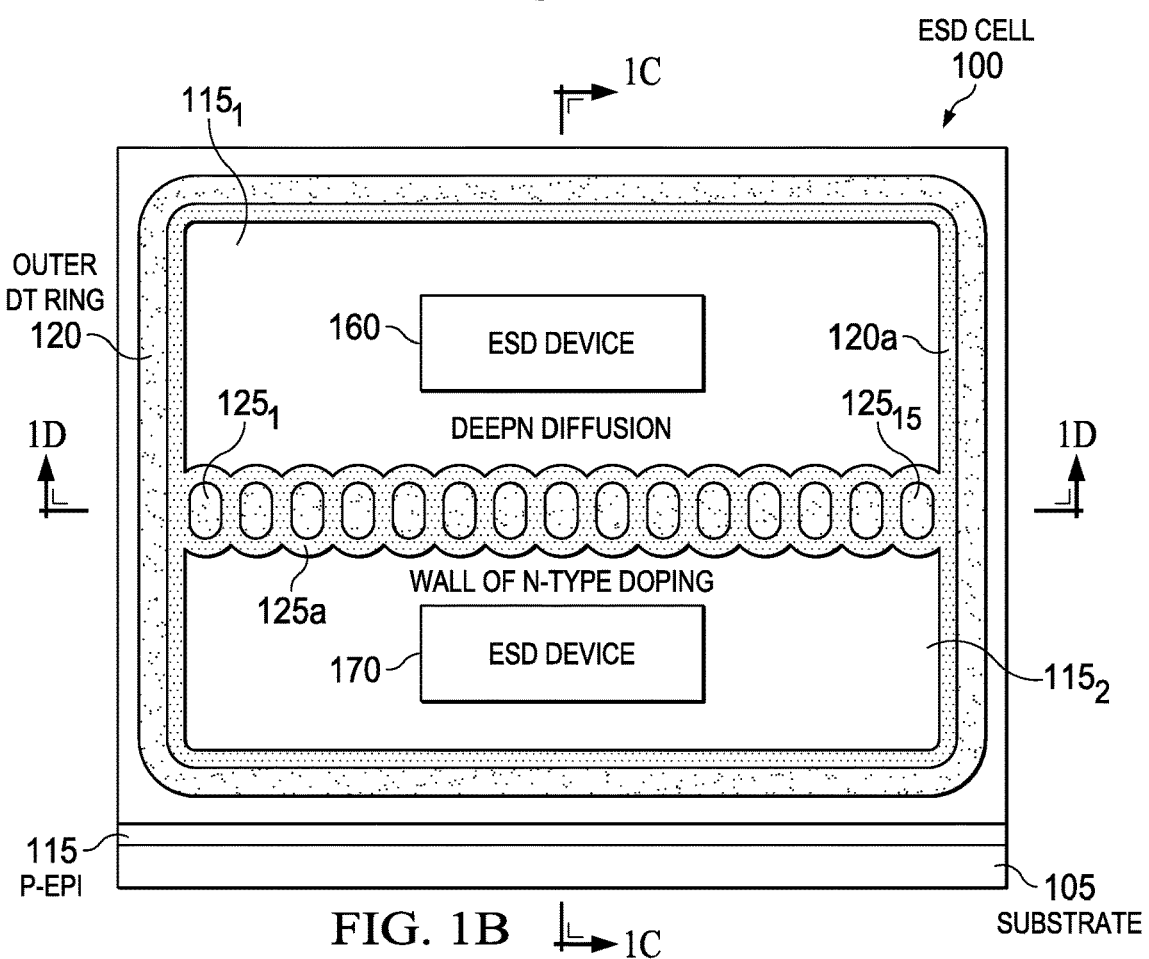
FIG. 1B shows the outer DT ring with the line of inner DT structures shown in FIG. 1A after a DEEPN diffusion process, where the plurality of inner DT structures have a sufficiently small inner DT structure spacing so that adjacent DEEPN diffusion regions overlap to form the continuous wall of n-type material shown which extends continuously from the first side to the second side of the outer DT ring to divide the enclosed p-epi region into a first p-epi region and a second p-epi region, wherein the NBL in the first p-epi region connects to the NBL in the second p-epi region, with the structure identified as an ESD cell, according to an example embodiment.

FIG. 1B shows the outer DT ring 120 with the line of inner DT structures shown in FIG. 1A after a deep n-type (DEEPN) diffusion process to provide a DEEPN diffusion 120a for the outer DT ring 120 configured to provide an outer ring (DEEPN ring) in the p-epi layer 115 region contacting the dielectric sidewalls extending downward from a topside of the p-epi layer 115 or from a surface n-type region formed in the topside of the p-epi layer 115 to the NBL 110 to enclose a portion of the p-epi layer 115 to define an enclosed p-epi region within. The DEEPN diffusion process also forms DEEPN diffusion regions 125a for each of the plurality of inner DT structures $125_1$ to $125_{15}$.

Figure 1C:
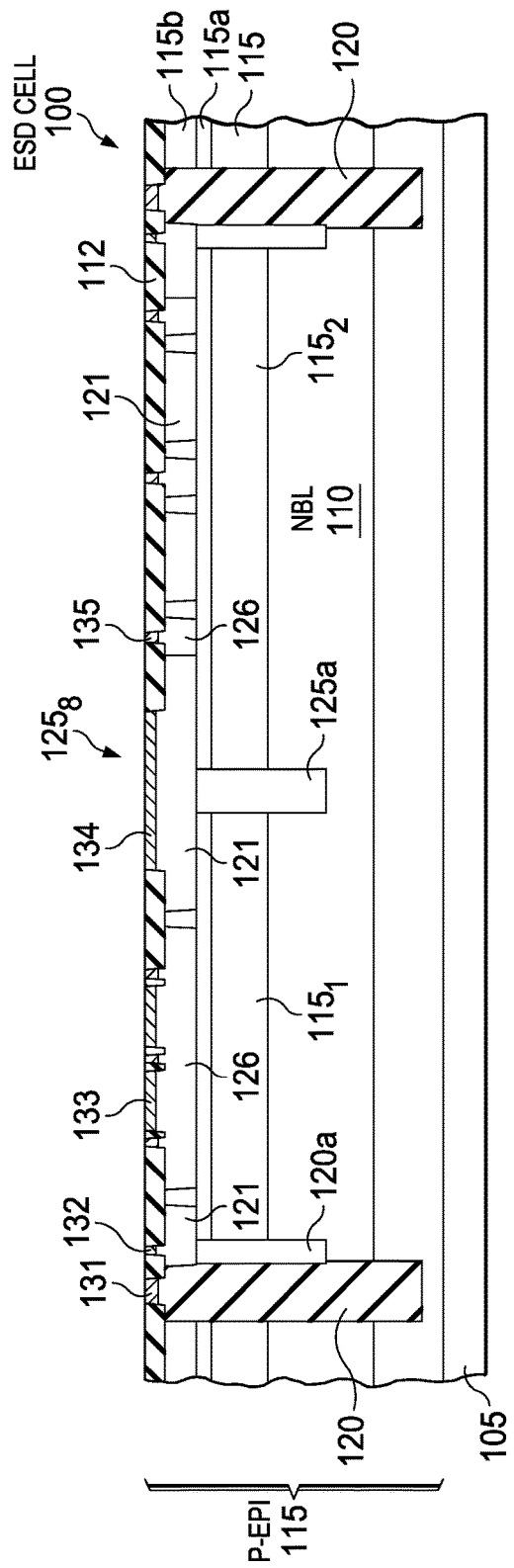
FIG. 1C is a vertical cross section derived from the ESD cell shown FIG. 1B showing a portion of a DEEPN wall separating the first and second p-epi regions, according to an example embodiment.

The plurality of inner DT structures $125_1$ to $125_{15}$ have a sufficiently small inner DT structure spacing so that adjacent ones of the DEEPN diffusion regions 125a as shown overlap to form the continuous wall of n-type material which extends continuously from the left side to the right side of the outer DT ring 120 to divide the enclosed p-epi region into a first p-epi region $115_1$ and a second p-epi region $115_2$, wherein the NBL in the first p-epi region connects to the NBL in the second p-epi region (see NBL 110 in FIG. 1C). A first ESD device 160 is shown in the first p-epi region $115_1$ and a second ESD device 170 is shown in the second p-epi region $115_2$ connected to one another through the NBL 110, with the overall structure shown identified as ESD cell 100. The first and second ESD devices 160 and 170 in one embodiment are both NPN devices.

FIG. 1C is a vertical cross section derived from the ESD cell 100 shown in FIG. 1B showing a portion of a DEEPN wall with DEEPN diffusion region 125a provided adjacent to inner DT structures $125_1$ to $125_{15}$ for separating the first and second p-epi regions $115_1$ and $115_2$, according to an example embodiment. Although not shown, in one typical example a two level metal stack with dielectric and vias through the dielectrics can be used for contact to contact regions shown between the shallow trench isolation (STI) 112 at the surface of the p-epi layer 115. The p-epi layer 115 can optionally include boron implant(s) which locally increase the p-type doping in the p-epi layer 115 shown as 115a and 115b above 115a. Surface nwell regions are shown as 121.

The outer DT ring 120 is shown having an optional p-doped filler. The surface nwell region 121 together with the DEEPN diffusion 120a connect the top surface of the p-epi layer 115 shown as contacts at the top of 115b to the NBL 110, including a p+ contact 131 to the p-doped filler of the outer DT ring 120 which provides a connection to the p-epi layer 115 below the NBL 110, n+ contact 132 to the surface nwell region 121 adjacent to the outer DT ring 120, n+ contact 133 to the emitter, n+ contact 134 to the surface nwell region 121 of the inner DT structure $125_8$, and p+ contact 135 to surface pwell regions 126.

Figure 1D:
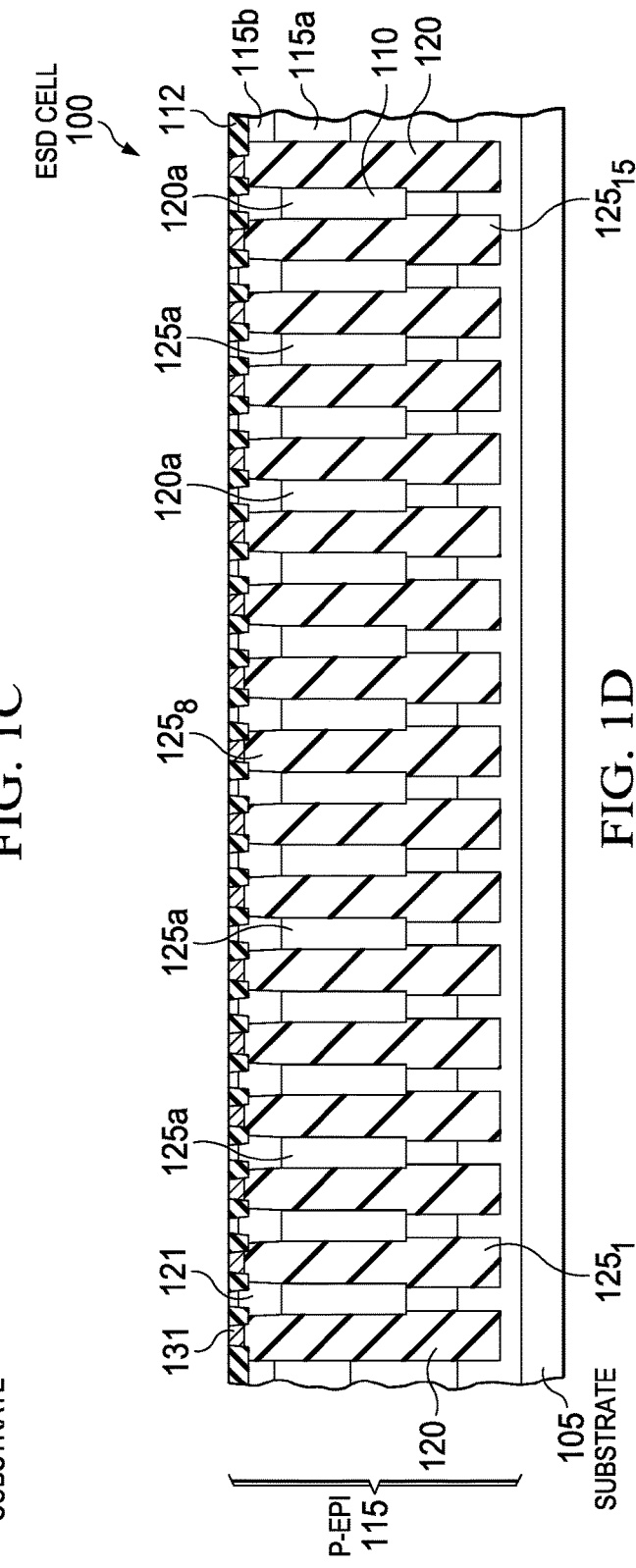
FIG. 1D is a horizontal cross section derived from the ESD cell shown FIG. 1B showing structure of the inner DT structures including merged DEEPN regions, according to an example embodiment.

FIG. 1D is a horizontal cross section derived from the ESD cell 100 shown FIG. 1B showing the structure of the 15 example inner DT structures $125_1$ to $125_{15}$ in a line providing a merged DEEPN diffusion regions 125a, according to an example embodiment. The outer structures are provided by the outer DT ring 120 including the DEEPN diffusions 120a. The inner DT structures $125_1$ to $125_{15}$ each can be dielectric lined and filled with a p+ material, such as p+ doped polysilicon, or be entirely dielectric filled.

Figure 2A:
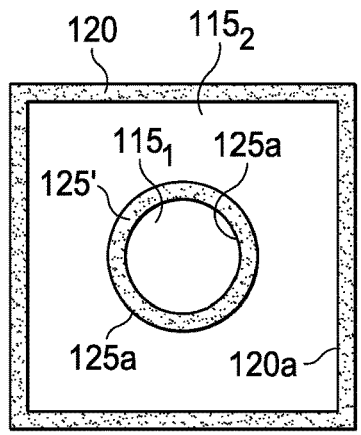
FIGS. 2A, 2B, 2C show various examples inner DT structure shapes being circular, rectangular, and L-shaped.
Figure 2B:
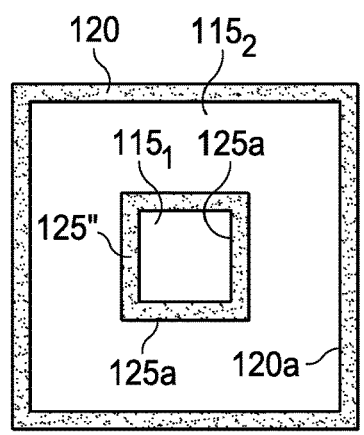
Figure 2C:
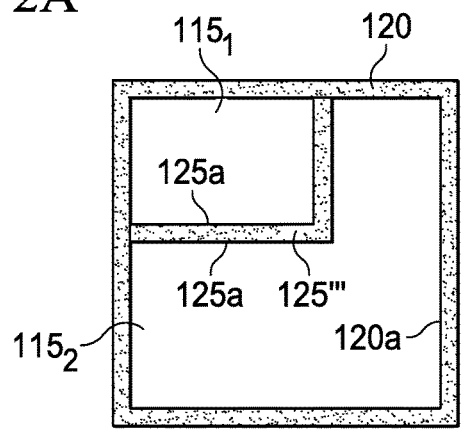

FIGS. 2A, 2B, 2C show various examples inner DT structures within an outer DT ring 120 to divide a p-epi layer 115 into first and second p-epi regions $115_1$ and $115_2$, shown as a circle 125', a rectangle or square 125", and an L-shape 125'", respectively. Many other shapes can be envisioned.

Figure 3:
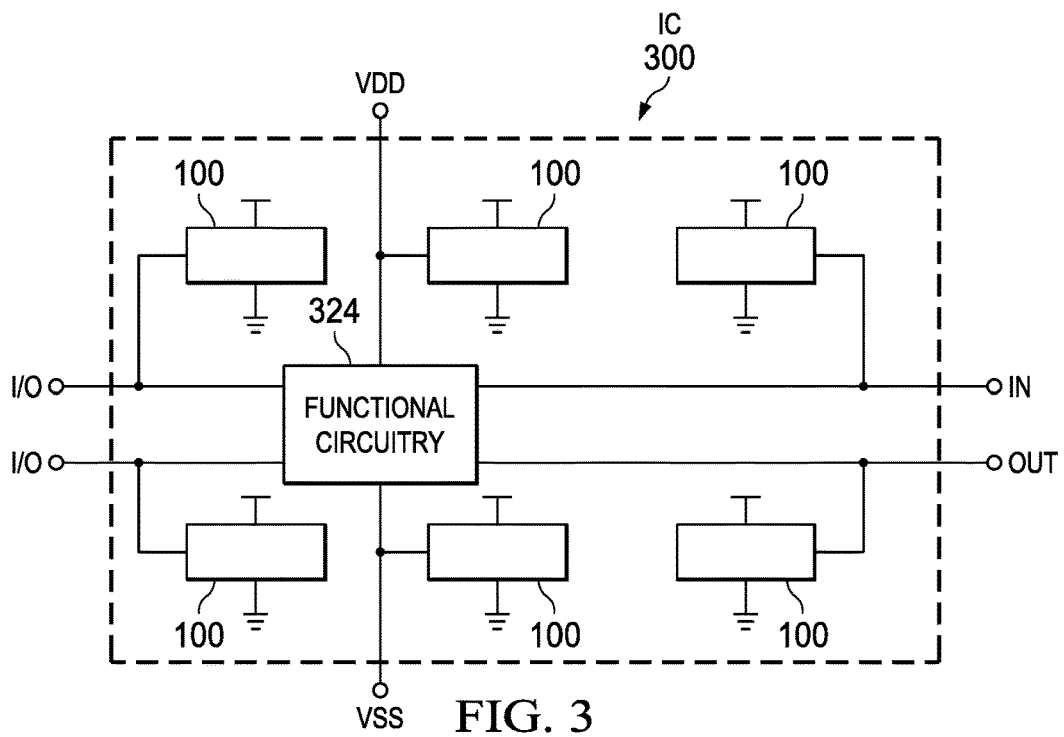
FIG. 3 illustrates a high level depiction of an ESD protected IC into which a plurality of disclosed ESD cells are incorporated to protect one or more terminals of the IC, according to an example embodiment.

FIG. 3 illustrates a high level depiction of a construction of an IC 300 into which disclosed ESD cells shown as ESD cells 100 functioning as ESD protection devices are incorporated to protect one or more terminals of the IC 300, according to an example embodiment. The "T" indicated at the top of the respective ESD cells 100 in FIG. 3 represents an input responsive to an ESD event provided by a suitable trigger circuit.

IC 300 includes functional circuitry 324, which is integrated circuitry that realizes and carries out desired functionality of IC 300, such as that of a digital IC (e.g., digital signal processor) or analog IC (e.g., amplifier or power converter). The capability of functional circuitry provided by IC 300 may vary, for example ranging from a simple device to a complex devoice. The specific functionality contained within functional circuitry 324 is not of importance to disclosed embodiments.

IC 300 also includes a number of external terminals, by way of which functional circuitry 324 carries out its function. A few of those external terminals are illustrated in FIG. 3. It is to be understood that the number of terminals and their function can also vary widely. In the example of IC 300 shown in FIG. 3, two terminals shown operate as common input and output terminals (I/O), by way of which functional circuitry 324 can receive incoming signals and can generate outputs, as well known in the art. A dedicated input terminal IN is also shown in FIG. 3 for IC, as is a dedicated output terminal OUT. Each of terminals IN, OUT are also connected to functional circuitry 324. Power supply terminal Vdd receives a positive power supply voltage in this example, while ground terminal Vss is provided to receive a reference voltage, such as system ground. Although not shown, the ground shown connected to the ESD cells 100 is coupled to VSS, such as resistively coupled or shorted together.

IC 300 includes an instance of a disclosed ESD cells 100 connected to each of its terminals. Each ESD cell 100 is connected to its corresponding terminal in parallel with the functional circuitry 324. ESD cells 100 are also connected to power supply and reference voltage terminals VDD, VSS, in parallel with functional circuitry 324. However, in some applications, some pins of the IC 300 being protected will be self-protecting, such as diode protected power supply pins. Pins also can be protected against different levels of ESD strike (Human Body Model (HBM), Charged Device Model (CDM), IEC, etc.). The functional circuitry 324 in IC 300 can be BiMOS circuitry having bipolar transistors and MOSFETs.

Disclosed embodiments include methods of isolating devices within a common tank. A blanket NBL is formed into a p-epi layer on a substrate that defines a buried portion of the p-epi layer (buried p-epi) below the NBL 110, generally using an n+ implant with a high temperature drive. At least a dielectrically lined outer deep trench isolation ring (outer DT ring 120) is formed including forming a trench, lining the trench with a dielectric liner to form dielectric sidewalls and filling the trench with a dielectric or polysilicon, then n-type implanting along the dielectric sidewalls of the p-epi layer 115 and annealing to form a DEEPN diffusion 120$a$ contacting the dielectric sidewalls and extending downward from a topside of the p-epi layer to the NBL configured in a ring (DEEPN ring). The DEEPN ring encloses a portion of the p-epi layer 115 to define an enclosed p-epi region within.

Simultaneously while forming the outer DT ring 120 (so that no processing is added) a plurality of inner DT structures (e.g., 125$_1$ to 125$_{15}$) are formed within the enclosed p-epi region each comprising at least dielectric sidewalls having a DEEPN diffusion 125$a$ contacting the dielectric sidewalls and extending downward from the topside surface of the p-epi layer 115 to the NBL 110. The plurality of inner DT structures have a sufficiently small inner DT structure spacing so that adjacent ones of the DEEPN diffusion regions 125$a$ overlap to form continuous wall of n-type material which extends from a first side to a second side of said outer DT ring 120 to divide the enclosed p-epi region 115 into a first p-epi region 115$_1$ and a second p-epi region 115$_2$, wherein the NBL 110 in the first p-epi region 115$_1$ connects to the NBL 110 in the second p-epi region 115$_2$.

A depth of the outer DT ring 120 and plurality of inner DT structures can be greater than a junction depth of the NBL 110, and the method can further comprise filling an inside of the outer DT ring 120 and an inside of the plurality of inner DT structures with polysilicon, and doping the polysilicon p-type to provide electrical contact to the buried p-epi layer under the NBL 110. The plurality of inner DT structures (e.g., 125$_1$ to 125$_{15}$) collectively by themselves can form a closed shape inside the outer DT ring.

The method can further comprise forming a first NPN ESD device in the first p-epi region 115$_1$ and a second NPN ESD device in the second p-epi region 115$_2$ connected to one another through the NBL 110, such as to provide either a bidirectional EDS cell or a back-to-back ESD cell. A center-to-center spacing between adjacent ones of the inner DT structures can be between 1.5 µm and 3 µm, and a width of the plurality of inner DT structures can be between 2 µm and 3 µm. The substrate 105 can comprise p-doped silicon having a doping level from $1\times10^{16}$ to $1\times10^{19}$ cm$^{-3}$, the p-epi layer 115 can comprise silicon that is 6 µm to 12 µm thick, and at least the buried p-epi layer can have a boron doping level from $3\times10^{14}$ cm$^{-3}$ to $3\times10^{16}$ cm$^{-3}$. The entire p-epi layer can have this doping level, or the surface portion can receive one or more additional p-type implants as described above.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

What is claimed is:

1. An integrated circuit, comprising:
   a p-type semiconductor substrate;
   a plurality of spaced-apart deep trench (DT) structures;
   a plurality of DEEPN diffusion regions, each DEEPN diffusion region surrounding a corresponding one of the DT structures and merging with at least one neighboring DEEPN diffusion region surrounding at least one neighboring DT structure; and
   an n-type buried layer (NBL) within the semiconductor substrate, wherein each DEEPN diffusion region extends from a surface of the semiconductor substrate through a p-type semiconductor layer to the NBL.

2. The integrated circuit of claim 1, wherein each DT structure extends from the surface through the NBL.

3. The integrated circuit of claim 1, wherein the DT structures each include a dielectric sidewall and a polysilicon core.

4. The integrated circuit of claim 3, wherein the polysilicon core connects to the p-type substrate below the NBL.

5. The integrated circuit of claim 1, wherein the DT structures form a linear array.

6. The integrated circuit of claim 1, further comprising a DT ring surrounding an enclosed area of the semiconductor substrate, wherein the plurality of DEEPN diffusion regions form a continuous DEEPN region connecting to first and second locations on the DT ring.

7. The integrated circuit of claim 6, wherein the plurality of DEEPN diffusion regions divide the enclosed area into first and second sub-areas, the first sub-area including a first electronic device and the second sub-area including a second electronic device.

8. The integrated circuit of claim 7, wherein the first and second electronic devices are electrostatic discharge (ESD) devices.

9. The integrated circuit of claim 7, wherein the NBL provides a current path between the first and second electronic devices.

10. An integrated circuit, comprising:
    a p-type semiconductor substrate;
    a plurality of spaced-apart deep trench (DT) structures;
    a plurality of DEEPN diffusion regions, each DEEPN diffusion region surrounding a corresponding one of the DT structures and merging with at least one neighboring DEEPN diffusion region surrounding at least one neighboring DT structure; and
    an n-type buried layer (NBL) within the semiconductor substrate, wherein each DT structure extends from a surface of the semiconductor substrate through the NBL.

11. The integrated circuit of claim 10, wherein the DT structures each include a dielectric sidewall and a polysilicon core.

12. The integrated circuit of claim 10, wherein polysilicon cores within the DT structures connect to the p-type substrate below the NBL.

13. The integrated circuit of claim 10, further comprising a DT ring surrounding an enclosed area of the semiconductor substrate, wherein the plurality of DEEPN diffusion regions form a continuous DEEPN region connecting to first and second locations on the DT ring.

14. The integrated circuit of claim 13, wherein the plurality of DEEPN diffusion regions divide the enclosed area into first and second sub-areas, the first sub-area including a first electronic device and the second sub-area including a second electronic device.

15. An integrated circuit, comprising:
a p-type semiconductor substrate;
a plurality of spaced-apart deep trench (DT) structures;
a plurality of DEEPN diffusion regions, each DEEPN diffusion region surrounding a corresponding one of the DT structures and merging with at least one neighboring DEEPN diffusion region surrounding at least one neighboring DT structure; and
a DT ring surrounding an enclosed area of the semiconductor substrate, wherein the plurality of DEEPN diffusion regions form a continuous DEEPN region connecting to first and second locations on the DT ring.

16. The integrated circuit of claim 15, further comprising an n-type buried layer (NBL) within the semiconductor substrate, wherein each DEEPN diffusion region extends from a surface of the semiconductor substrate through a p-type semiconductor layer to the NBL.

17. The integrated circuit of claim 16, wherein the continuous DEEPN region is located between first and second electronic devices, and the NBL provides a current path between the first and second electronic devices.

18. The integrated circuit of claim 15, further comprising an n-type buried layer (NBL) within the semiconductor substrate, wherein each DT structure extends from a surface of the semiconductor substrate through the NBL.

19. The integrated circuit of claim 15, wherein the DT structures each include a dielectric sidewall and a polysilicon core.

* * * * *